United States Patent
Nakagawa et al.

(10) Patent No.: US 6,752,545 B2
(45) Date of Patent: Jun. 22, 2004

(54) ALKALI-BASED TREATING LIQUID, TREATING LIQUID ADJUSTING METHOD AND EQUIPMENT, TREATING LIQUID SUPPLYING METHOD AND EQUIPMENT

(75) Inventors: Toshimoto Nakagawa, Kawasaki (JP); Yuko Katagiri, Kawasaki (JP); Shu Ogawa, Tokyo (JP); Satoru Morita, Tokyo (JP); Makoto Kikukawa, Yokohama (JP); Takahiro Hozan, Tatsuno (JP)

(73) Assignees: Nagase & Co., Ltd. (JP); Hirama Laboratories Co., Ltd. (JP); Nagase CMS Technology Co., Ltd. (JP)

( * ) Notice: Subject to any disclaimer, the term of this patent is extended or adjusted under 35 U.S.C. 154(b) by 0 days.

(21) Appl. No.: 10/216,661

(22) Filed: Aug. 9, 2002

(65) Prior Publication Data

US 2003/0096199 A1 May 22, 2003

(30) Foreign Application Priority Data

Aug. 16, 2001 (JP) ..................................... P2001-247362

(51) Int. Cl.$^7$ ............................................... G03D 5/00
(52) U.S. Cl. ......................... 396/611; 396/627; 118/52; 427/420
(58) Field of Search ................................ 396/604, 611, 396/627; 118/52, 319–321; 430/5; 427/240

(56) References Cited

U.S. PATENT DOCUMENTS

| | | | | |
|---|---|---|---|---|
| 5,405,508 A | * | 4/1995 | Kawakami et al. | .......... 205/437 |
| 5,545,309 A | * | 8/1996 | Shimizu et al. | ............. 210/690 |
| 6,083,670 A | * | 7/2000 | Sugawara et al. | .......... 430/399 |
| 6,187,519 B1 | * | 2/2001 | Sugawara | .................... 430/399 |

FOREIGN PATENT DOCUMENTS

JP         2561578          2/1993          ............. G03F/7/30

OTHER PUBLICATIONS

Patent Abstracts of Japan, Publication No. 05–040345, dated Feb. 19, 1993, 1 page.

* cited by examiner

*Primary Examiner*—D. Rutledge
(74) *Attorney, Agent, or Firm*—Osha & May L.L.P.

(57) ABSTRACT

A treating liquid adjusting equipment for adjusting an alkali-based treating liquid for use in treating an organic film applied onto a substrate, which includes an adjusting portion. The adjusting portion for adjusting an alkalinity of the alkali-based treating liquid is such that a concentration of a first component contained in the alkali-based treating liquid and constituting an organic film of a same type as or different type from the organic film is in a range of 0.0001 to 2.0 mass %, and a concentration of an alkali component contained in the alkali-based treating liquid is in a range of 0.05 to 2.5 mass %.

10 Claims, 5 Drawing Sheets

US 6,752,545 B2

ALKALI-BASED TREATING LIQUID, TREATING LIQUID ADJUSTING METHOD AND EQUIPMENT, TREATING LIQUID SUPPLYING METHOD AND EQUIPMENT

BACKGROUND OF THE INVENTION

1. Field of the Invention

The present invention relates to an alkali-based treating liquid, a method and an equipment for adjusting the same, and a method and an equipment for supplying an alkali-based treating liquid. More specifically, the present invention relates to an alkali-based treating liquid for use in the development or formation with treatment of an organic film, such as a photoresist or a functional film, applied onto a substrate, a method and an equipment for adjusting this alkali-based treating liquid, and a method and an equipment for supplying the alkali-based treating liquid for the development of the photoresist, the treatment of the functional film or the like.

2. Description of the Related Art

In fields such as manufacturing of micro-devices and microfabrication (micromachining), various kinds of organic films are recently employed for different purposes. Typical examples of such organic films include thin films of organic photosensitive resin compositions called photoresists, which are essential to photolithography, and so-called functional organic films.

Photolithographic techniques are widely used for transferring micropatterns to wafers and other substrates in the manufacturing of semiconductor devices, such as memories and logical circuits, and liquid crystal devices. The photolithographic process is an essential part of the manufacturing processes of the above-described devices, and generally involves applying a thin film of photoresist onto a wafer, for example, by spin coating, and exposing the film through a mask with light, followed by development, thereby transferring the mask pattern to the wafer.

There are many different types of photoresists employed in such photolithographic processes, depending on the applications or requirements. Examples include positive and negative resists, i-line resists, and resists for KrF and ArF eximer lasers. These photoresists can also be classified, in terms of the materials used, into various types, including DQN resists containing the matrix material novolac (N; Novolac) resin and a diazoquinone (DQ)—based photosensitizer added thereto, resists containing a photo acid generator and chemically amplified resists. In the development of these photoresists (especially, the positive resists), alkali-based developing liquids, such as tetramethyl ammonium hydroxide (TMAH) aqueous solution and potassium hydroxide (KOH) aqueous solution, are widely employed.

Generally, in the lithographic process for the manufacturing of semiconductor devices and liquid crystal devices, the development is performed by applying an alkali-based developing liquid to an exposed photoresist by the spray method, paddle method, or dip method. In many cases, the developing liquid used in this process is not reused, that is, a fresh developing liquid is disposed of after one use. This tendency is particularly strong in the manufacturing of semiconductor devices.

Some of the possible reasons are as follows: (1) The amount used of the developing liquid per wafer is small, since the standard size for wafers currently used in the manufacturing of semiconductor devices is 8 inches (200 mm φ); (2) The developing liquid is diluted with rinse water, so that the alkali concentration of the solution is decreased; (3) If the developing liquid is reused, the increase and accumulation of particles, metal ions and the like contained in the solution may have an undesirable effect during the following processes; and (4) The developing liquid is not necessarily controlled sufficiently in a manner suitable for each of the different applications and materials of photoresists and developing liquids described above.

Meanwhile, examples of the functional film include protective films for preventing the degradation and damage of liquid crystal display devices, semiconductor circuit devices and the like; smoothing films for smoothing surfaces of the devices; interlayer insulating films for insulating interconnects disposed in the form of layers; spacers for maintaining a constant interval between two substrates that seal the liquid crystal of a liquid crystal panel; liquid crystal alignment films capable of aligning liquid crystals; light scattering films for achieving a high front brightness for semi-transparent and reflective liquid crystal displays; and low dielectric constant films having low dielectric constants. Examples of the functional organic film include microlenses serving as optical devices. These functional films have superior properties according to their applications, such as electrical insulation, flatness, heat resistance, transparency, chemical resistance and mechanical strength.

In general, these functional films are each composed mainly of an alkali-soluble organic resin. Like photoresists, functional films can be classified roughly into positive and negative types, and the lithographic process is frequently used for the formation treatment of the films. The lithographic process used in the manufacturing of the functional films also involves applying an alkali-based treating liquid onto an exposed functional film by the spray method, paddle method, or dip method. Usually, the treating liquid used in this process is not reused, and, in many cases, a fresh treating liquid is disposed of after one use.

SUMMARY OF THE INVENTION

In recent years, further miniaturization has been accelerating for semiconductor devices, liquid crystal devices, micro-components such as micromachines and the like. In particular, the miniaturization of semiconductor devices, along with the reduction in layer thickness thereof, has been proceeding at a rapid pace that is unexpected from conventional design rules. For instance, the manufacturing of semiconductor memory products by a 0.13 μm process is already underway, and the photolithography thus plays an increasingly important role in the manufacturing process. Accordingly, it is required to reliably achieve finer line widths than ever in the patterning of photoresists. Under such circumstances, in order to prevent yield loss, it is necessary to further reduce particles and the like entering the developing liquid. For this reason, the developing liquid may continue to be disposed of after one use.

At the same time, an increase in wafer size has also been promoted for increased productivity, along with the miniaturization and the reduction in layer thickness. Accordingly, 300 mmφ wafers produced by single wafer processing are expected to soon become the standard. This will increase the amounts of developing liquid and rinse water to be used, leading to an increase in material cost and in the amounts of liquid wastes of the developing liquid and rinse water to be generated and treated. In addition to the foregoing, the inventors of the present invention acquired the following findings as a result of in-depth research on the conventional photoresist (positive resist) development process employing a fresh developing liquid.

In general, a photoresist applied onto a wafer is pre-baked to be fixed, and is then exposed and developed. In the case of the positive resist, the functional group in the exposed portion is converted to carboxylic acid or other chemical form that reacts readily with alkali, so that the dissolution rate of the exposed portion of the resist in an alkali-based developing liquid becomes significantly higher than that of the unexposed portion. Here, a positive resist is applied onto a metal thin film formed on a wafer, and then, after the photoresist is exposed and developed to perform patterning, the metal thin film is etched. In this case, the metal thin film is etched in the portion exposed under the exposed portion of the photoresist that has been dissolved in the development process.

However, it was found that, under certain conditions, poor etching could occur in the above-described portion of the metal thin film. Such poor etching either reduces the conductivity and results in lower product reliability, or causes conduction failure leading to defective products, thereby decreasing yield. Moreover, with the miniaturization of semiconductor devices and liquid crystal devices and the reduction in layer thickness thereof, this phenomenon may occur with a higher probability, resulting in a decrease in productivity.

The inventors of the present invention conducted further research on the cause of the poor etching. As a result, the inventors of the present invention found that, either in the post-baking or hard-baking after the development process, or in the rinsing step, the surface layer or surface of the photoresist remaining on the wafer peels off and the peeled pieces adhere onto the exposed metal thin film, which is one factor of impeding the etching. Furthermore, if the above-described phenomenon has something to do with the solubility of the developing liquid, not only the exposed portion, but also the unexposed portion may not be sufficiently dissolved by the conventional photoresist development method employing a fresh liquid. In order to achieve finer pattern line widths, there is a demand for further improvement in the solubility and the selective solubility of the developing liquid in the development process.

Furthermore, a problem similar to the poor etching in the development process of photoresists as described above may also occur in the formation or formation treatment of functional films. That is, when treating an exposed functional film with an alkali-based treating liquid, poor treatment may result in the same manner as in the case of the poor etching that may result in the photoresist.

In view of the foregoing problems, it is an object of the present invention to provide an alkali-based treating liquid for use in the development or treatment of an organic film, such as a photoresist or a functional film, applied onto a substrate, that is capable of reducing the amount of the alkali-based treating liquid used and the amount of liquid waste produced, has excellent solubility with respect to an exposed organic film, and is capable of sufficiently preventing poor development and poor treatment, such as the peeling of the surface layer of the organic film. It is another object of the present invention to provide a method and an equipment for adjusting the alkali-based treating liquid, and a method and an equipment for supplying the alkali-based treating liquid to the processes and facilities in which the development or treatment is performed.

In order to solve the above problems, the inventors of the present invention conducted in-depth research based on the above findings, and found that a slightly soluble film exhibiting dissolution-resistance against an alkali-based developing liquid is formed in the surface layer of an unexposed portion of a positive photoresist, and this film portion is peeled from an underlying layer thermally or mechanically in a post baking or rinse process after development, and thus the surface layer peels off. It is also found that the permeability of the alkali-based developing liquid to the photoresist is one factor that affects the solubility of the resist, and in particular, it can affect significantly the initial solubility of the photoresist on which surface the slightly soluble film is formed.

Moreover, it was confirmed that this phenomenon is also seen in the formation and treatment of a functional film such as a protective film, a smoothing film, an interlayer insulating film, a spacer between substrates, a liquid crystal alignment film, a light scattering film, a low dielectric constant film, and a microlens.

The inventors of the present invention further proceeded with the research based on the above findings and achieved the present invention.

More specifically, the present invention is an alkali-based treating liquid for use in development treatment of a photoresist applied onto a substrate or formation treatment of the above-described various organic functional films, that is, for use in treating a photosensitive organic film, and is characterized in that a first component (organic film component) constituting an organic film of the same type as or a different type from the organic film to be treated is dissolved in a concentration of 0.001 to 2.0 mass %.

Thus, the alkali-based treating liquid of the present invention contains a certain concentration of the first component (dissolved organic film component) dissolved as a constituent component. This alkali-based treating liquid containing the first component has a significantly higher wettability with respect to an exposed organic film applied on a wafer than that of prior art employing a fresh liquid. More specifically, it was confirmed that the surface tension of the alkali-based treating liquid on the organic film was reduced significantly. Thus, the alkali-based treating liquid can permeate readily into the surface of the organic film, and be easily absorbed therein.

In particular, in the example of the photoresist described above, the alkali-based treating liquid (alkali-based developing liquid in this case) is sufficiently absorbed also into the slightly soluble film in an unexposed portion, so that the dissolution of the slightly soluble film is facilitated. It is preferable that the first component dissolved has a similar composition to that of the organic film to be treated, more preferably the same or substantially the same composition of the organic film to be treated, because the wettability of the alkali-based treating liquid and the organic film is further increased, which facilitates the permeation. Further more, it is desirable that the alkali-based treating liquid contains the same type of matrix and/or photosensitizer as the organic film to be treated.

When the concentration of the first component dissolved is less than 0.001 mass %, the permeability of the alkali-based treating liquid to the organic film is not sufficiently increased, and an advantage over a conventional fresh liquid can be hardly provided. On the other hand, when the concentration of the first component exceeds 2.0 mass %, erosion (edge effect) may be significant in an edge portion on the upper surface of the organic film remaining as a pattern (corresponding to an unexposed portion in the positive type), and the following processes such as etching of the underlying layer and film formation may be adversely affected, and therefore this range is not preferable. When the concentration of the first component dissolved exceeds 2.0 mass %, the permeability corresponding to the concentration is hardly exhibited. In this specification, the component concentration contained in the alkali-based treating liquid is defined on the mass basis, that is, "mass %", which is substantially equal to "weight %", that is, the weight basis (which also applies to the following).

It is preferable that when the organic film is a photoresist and the treatment is a development, a second component, serving as the first component, constituting an organic film of the same type as or different type from the photoresist to be developed is dissolved in a concentration of 0.001 to 2.0 mass %, preferably 0.01 to 1.5 mass %, and more preferably 0.1 to 1.0 mass %. When the second component is a photoresist component of the same type as or a different type from the photoresist to be developed, the second component substantially becomes the photoresist component. The second component may be an organic film component other than the photoresist component, for example, a functional film component as described later.

In this case, the alkali-based treating liquid functions as an alkali-based developing liquid containing the second component dissolved as a constituent component in the above-described concentration. This alkali-based treating liquid containing the second component dissolved has a significantly higher wettability with respect to an exposed organic film applied on a wafer than that of prior art employing a fresh liquid. This seems to be because the surface tension of the alkali-based treating liquid on the photoresist is reduced significantly, and the alkali-based treating liquid can permeate readily into the surface of the photoresist.

It is preferable that the second component dissolved has a similar composition to that of the photoresist to be developed, more preferably the same or substantially the same composition of the photoresist to be developed, because the wettability of the alkali-based treating liquid and the photoresist is further increased, which facilitates the permeation. Furthermore, it is further desirable that the alkali-based treating liquid contains the same type of matrix and/or photosensitizer as the photoresist to be developed.

When the concentration of the second component dissolved is less than 0.001 mass %, the permeability of the alkali-based treating liquid to the photo resist is not sufficiently increased, and an advantage over a conventional fresh liquid can be hardly provided. On the other hand, when this concentration exceeds 2.0 mass %, erosion (edge effect) may be significant in an edge portion on the upper surface of the photoresist remaining as a pattern (corresponding to the unexposed portion in the positive type and the exposed portion in the negative type), and the following processes such as etching of the underlying layer and film formation may be adversely affected, and therefore this range is not preferable. When the concentration of the second component exceeds 2.0 mass %, the permeability corresponding to the concentration is hardly exhibited.

Alternatively, it is also useful that when the organic film is a functional film, a third component (functional film component), serving as the first component, constituting an organic film of the same type as or a different type from the functional film to be treated is dissolved in a concentration of preferably 0.001 to 0.5 mass %, more preferably 0.01 to 0.3 mass %. When the third component is a functional film component of the same type as or a different type from the functional film to be treated, the third component substantially becomes the functional film component. The third component may be an organic film component other than the functional film component, for example, the photoresist component as described above.

Hereinafter, the "functional film" of the present invention will be described. The functional film is a sort of a permanent film that contains a photosensitive organic polymer resin as the main component, can be treated to a desired patterning geometry by the alkali treating liquid, and can stay in a substrate as a structural element without being subjected to a stripping process thereafter to carry out various required functions. On the other hand, the photoresist serves as a resist (resistive film) for patterning by etching of a metal thin film or a metal oxide thin film on a substrate, and is removed by resist stripping after etching, and eventually does not exist on the substrate, that is, a provisional film that is temporarily used.

Examples of positive type functional films of such functional films include films made of a solution of the following substances as the raw material: alkali soluble organic resins (unsaturated carboxylic acid, unsaturated carboxylic acid anhydride, epoxy group-containing unsaturated compounds, resins containing copolymers of olefin based unsaturated compounds or the like, resins containing alkali soluble cyclic polyolefin based resins, etc.), solvents, or 1,2-quinone diazide compounds serving as a photosensitizer.

After this raw solution is applied onto a substrate, the substrate is prebaked so that the solvent is volatilized, and a positive type photosensitive coating film is formed.

Then, the film is exposed to ultraviolet rays via a mask having a predetermined shape or the like, and thereafter the exposed portion is dissolved in the alkali-based treating liquid of the present invention. The substrate with the remaining unexposed portion is post-baked, and thus a functional film having a predetermined pattern is obtained.

Examples of negative type functional films include films made of a solution of the following substances as the raw material: alkali soluble organic resins (unsaturated carboxylic acid, unsaturated carboxylic acid anhydride, epoxy group-containing unsaturated compounds, resins containing copolymers of olefin based unsaturated compounds or the like), polymeric compounds having an ethylene unsaturated bond, solvents, or radiation-sensitive polymerization initiator.

After this raw solution is applied onto a substrate, the substrate is prebaked so that the solvent is volatilized, and a negative type photosensitive coating film is formed. Then, the film is exposed to ultraviolet rays via a mask having a predetermined shape or the like, and thereafter the unexposed portion is dissolved in the alkali-based treating liquid of the present invention. The substrate with the remaining exposed portion is post-baked, and thus a functional film having a predetermined pattern is obtained.

With respect to such a functional film, the alkali-based treating liquid functions as an alkali-based formation treating liquid containing the third component (dissolved functional film component) dissolved as a constituent component in the above-described concentration. This alkali-based treating liquid containing the third component dissolved has a significantly higher wettability with respect to an exposed organic film applied on a wafer than that of prior art employing a fresh liquid. This seems to be because the surface tension of the alkali-based treating liquid on the functional film is reduced significantly, and the alkali-based treating liquid can permeate readily into the surface of the functional film.

It is preferable that the third component dissolved has a similar composition to that of the functional film to be treated, more preferably the same or substantially the same composition of the functional film to be treated, because the wettability of the alkali-based treating liquid and the functional film is further increased, which facilitates the permeation. Furthermore, it is desirable that the alkali-based treating liquid contains the same type of matrix and/or photosensitizer as the functional film to be treated.

When the concentration of the third component dissolved is less than 0.001 mass %, the permeability of the alkali-based treating liquid is not sufficiently increased, and an advantage over a conventional fresh liquid can be hardly provided. On the other hand, when the concentration of the third component exceeds 0.5 mass %, erosion may be significant in an edge portion on the upper surface of the functional film remaining as a pattern (corresponding to the unexposed portion in the positive type and the exposed portion in the negative type), and a desired pattern cannot be obtained, and therefore this range is not preferable.

Alternatively, the alkali component in the alkali-based treating liquid is a principle factor that affects the solubility of the organic film, and more specifically, it is preferable that the alkali component is contained in a concentration of 0.05 to 2.5 mass %. In such a preferable range, the concentration can be controlled as appropriate, in accordance with the type of the organic film to be treated and/or the alkali.

Furthermore, when the organic film is a photoresist, it is preferable that the alkali component is contained in a concentration of preferably 0.1 to 2.5 mass %, and more preferably 0.1 to 2.4 mass %.

More specifically, for example, for an alkali-based developing liquid for photoresists for use in the manufacturing of semiconductor devices, it is useful that the alkali component (e.g., TMAH) is contained preferably in 2.2 to 2.4 mass %, more preferably 2.3 to 2.4 mass %. For an alkali-based developing liquid for photoresists (e.g., DQN resist) for use in the manufacturing of liquid crystal devices, it is useful that the alkali component is contained preferably in 2.2 to 2.4 mass %, and more preferably 2.3 to 2.4 mass %.

When the concentration of the alkali component is less than 0.1 mass %, the rate of dissolution of the photoresist tends to be reduced to an degree that is insufficient in practical use. On the other hand, when the concentration of the alkali component is more than 2.5 mass %, the solubility corresponding to an increase of the concentration cannot be obtained, and in some cases, this concentration makes it difficult to control the solubility of the photoresist and patterning geometry.

Alternatively, when the organic film is a functional film, it is preferable that the alkali component in the alkali-based treating liquid is contained in a concentration of preferably 0.05 to 2.4 mass %, and more preferably 0.08 to 2.4 mass %.

More specifically, for example, for the alkali-based treating liquid for a negative type (meth) acrylic functional film that is preferably used as a protective film and a spacer, it is useful that the concentration of the alkali component (e.g., TMAH) is preferably 0.05 to 0.6 mass %, and more preferably 0.08 to 0.12 mass %. For the alkali-based treating liquid for a positive type (meth) acrylic functional film that is preferably used as a protective film or an interlayer insulating film and a spacer, the concentration of the alkali component (e.g., TMAH) is preferably 0.05 to 0.6 mass %, and more preferably 0.1 to 0.3 mass %.

For the alkali-based treating liquid for a negative type (meth) acrylic functional film that is preferably used as a protective film and a liquid crystal alignment film, it is useful that the concentration of the alkali component (e.g., TMAH) is preferably 0.05 to 0.6 mass %, and more preferably 0.3 to 0.6 mass %. For the alkali-based treating liquid for a positive type epoxy based functional film that is preferably used as a microlens, it is useful that the concentration of the alkali component (e.g., TMAH) is preferably 0.5 to 2.4 mass %, and more preferably 1.0 to 2.4 mass %. For the alkali-based treating liquid for a negative type (meth)acrylic functional film that is preferably used as an interlayer insulating film, it is useful that the concentration of the alkali component (e.g., TMAH) is preferably 1.0 to 2.4 mass %, and more preferably 2.3 to 2.4 mass %.

When the concentration of the alkali component is less than 0.05 mass %, the rate of dissolution of the functional film tends to be reduced to an degree that is insufficient in practical use. On the other hand, when the concentration of the alkali component is more than 2.4 mass %, the solubility corresponding to an increase of the concentration cannot be obtained, and in some cases, this concentration makes it difficult to control the solubility of the functional film and patterning geometry.

In another aspect, a method for adjusting an alkali-based treating liquid of the present invention is a method for efficiently adjusting the alkali-based treating liquid of the present invention and a method for adjusting the alkali-based treating liquid for use in a process for treating (or processing) an organic film applied onto a substrate, and is characterized in that the alkalinity of the alkali-based treating liquid is adjusted such that the concentration of a first component (dissolved organic film component) contained in the alkali-based treating liquid and constituting an organic film of a same type as or different type from the organic film to be treated is in the range of 0.001 to 2.0 mass %, and the concentration of an alkali component contained in the alkali-based treating liquid is in the range of 0.05 to 2.5 mass %.

More specifically, for example, the concentrations of the first component dissolved and the alkali component contained in the alkali-based treating liquid are measured when appropriate, and based on respective actually measured values and preset concentration values, the following operation can be performed manually or automatically, when appropriate: when the actually measured values do not reach the desired preset values, the first component or alkali is added and dissolved, whereas when the actually measured values exceeds the desired preset values, the alkali-based treating liquid is diluted. Alternatively, the amounts of the alkali and the photoresist added to and dissolved in a solvent of the alkali-based treating liquid may be measured and controlled.

Furthermore, it is preferable that when the organic film is a photoresist and the treatment is a development, the alkalinity of the alkali-based treating liquid is adjusted such that the concentration of a second component, serving as the first component, contained in the alkali-based treating liquid and constituting an organic film of the same type as or a different type from the photoresist to be developed is in the range of 0.001 to 2.0 mass %, and the concentration of an alkali component contained in the alkali-based treating liquid is in the range of 0.1 to 2.5 mass %.

More specifically, for example, the concentrations of the second component dissolved and the alkali component contained in the alkali-based treating liquid are measured when appropriate, and based on respective actually measured values and preset concentration values, the following operation can be performed manually or automatically, when appropriate: when the actually measured values do not reach the desired preset values, the second component or alkali is added and dissolved, whereas when the actually measured values exceeds the desired preset values, the alkali-based treating liquid is diluted. Alternatively, the amounts of the alkali and the second component added to and dissolved in a solvent of the alkali-based treating liquid may be measured and controlled.

Alternatively, it is preferable that when the organic film is a functional film, the alkalinity of the alkali-based treating liquid is adjusted such that the concentration of a third component, serving as the first component, contained in the alkali-based treating liquid and constituting an organic film of the same type as or a different type from the functional film to be treated is in the range of 0.001 to 0.5 mass %, and the concentration of an alkali component contained in the alkali-based treating liquid is in the range of 0.05 to 2.4 mass %.

More specifically, for example, the concentrations of the third component dissolved and the alkali component contained in the alkali-based treating liquid are measured when appropriate, and based on respective actually measured values and preset concentration values, the following operation can be performed manually or automatically, when appropriate: when the actually measured values do not reach the desired preset values, the third component or alkali is added and dissolved, whereas when the actually measured values exceeds the desired preset values, the alkali-based treating liquid is diluted. Alternatively, the amounts of the alkali and the third component added to and dissolved in a solvent of the alkali-based treating liquid may be measured and controlled.

In another aspect, a method for supplying an alkali-based treating liquid of the present invention is a method for supplying the alkali-based treating liquid adjusted according to the present invention to a treating process of an organic film applied onto a substrate, and includes (1) the receiving step of receiving a used liquid containing a first component (organic film component) constituting an organic film of a same type as or different type from the organic film; (2) the concentration measuring step of measuring concentrations of the first component (dissolved organic film component) and an alkali component contained in the used liquid; (3) the adjusting step of adjusting the alkalinity of the used liquid, based on the actually measured concentration values of the first component and the alkali component, such that the concentration of the first component contained in the used liquid is in the range of 0.001 to 2.0 mass %, and the concentration of the alkali component contained in the used liquid is in the range of 0.05 to 2.5 mass %, thereby producing a regenerated liquid; and (4) the supplying step of supplying the regenerated liquid to the treating process. The used liquid that is received in the receiving step can be a liquid that has been supplied in the supplying step and used in the treating step, or a liquid that has been used in another facility.

The used liquid received in the receiving step has been subjected to a treatment of, for example, an organic film and contains the first component dissolved or dispersed therein, and generally has been diluted with rinse water so that the content of the alkali component becomes smaller than that in the early stage. In the concentration measuring step, the concentrations of the first component dissolved and the alkali component contained in this used liquid are measured. Then, in the adjusting step, these actually measured values are compared with, for example, the preset concentration values. When they are insufficient, the first component and/or the alkali are supplemented in accordance with the difference, whereas when they are excessive, the liquid is diluted as appropriate. In this case, it is preferable to perform the concentration measuring step and the adjusting step continuously in parallel and perform feedback control of the concentrations. Then, a regenerated liquid whose concentrations of the first component dissolved and the alkali component are adjusted to be in the above-described predetermined ranges is supplied to a treating step of an organic film.

It is preferable that when the organic film is a photoresist and the treatment is a development, the alkalinity of the used liquid is adjusted, such that the concentration of the second component, serving as the first component, contained in the alkali-based treating liquid and constituting an organic film of the same type as or different type from the photoresist to be developed is in the range of 0.001 to 2.0 mass %, and the concentration of an alkali component contained in the alkali-based treating liquid is in the range of 0.1 to 2.5 mass %. In this case, a regenerated liquid containing the second component and the alkali component in the above-described ranges is supplied to a developing step of the photoresist.

Alternatively, it is preferable that when the organic film is a functional film, the alkalinity of the alkali-based treating liquid is adjusted such that the concentration of the third component, serving as the first component, contained in the alkali-based treating liquid and constituting an organic film of the same type as or different type from the functional film to be treated is in the range of 0.001 to 0.5 mass %, and the concentration of an alkali component contained in the alkali-based treating liquid is in the range of 0.05 to 2.4 mass %. In this case, a regenerated liquid containing the third component and the alkali component in the above-described ranges is supplied to a treating step of the functional film.

Furthermore, it is preferable that the method includes (5) a pre-treating step performed between the receiving step and the adjusting step, including at least one step selected from the group consisting of the filtrating step of filtrating the used liquid; the residual component removing step of removing the first component (or the second component or the third component) that remains in the used liquid; and the metal component removing step of removing a metal component contained in the used liquid:

When a liquid that has been used for a treatment of an organic film is used as the used liquid, the first component may remain in the form of being dispersed, dissolved, or residue in some cases, etc., and furthermore the liquid may contain metal ions or the like that are dissolved in the course of being supplied to the receiving step. It is necessary to prevent contamination of these substances in the manufacturing of devices such as semiconductor devices and liquid crystal devices or micromachining thereof, and therefore it is preferable to perform the filtrating step and the metal component removing step. The used liquid may contain the first component dissolved in a concentration of more than 2.0 mass %, that is, the upper limit of the above predetermined range, and it is preferable to perform the residual component removing step to remove a certain amount of the first component before the adjusting step.

It is preferable that in the filtrating step, the used liquid is filtrated into a permeated liquid and an unpermeated liquid by cross flow filtration, and the adjusting step includes an unpermeated liquid adding step of adding the unpermeated liquid to the used liquid. Herein, the "permeated liquid" generally refers to components (permeated components) that have permeated filtrating means in filtration and is constituted mainly or substantially by liquid components. The "unpermeated liquid" generally refers to components (unpermeated components) that have not permeated the filtrating means in filtration. In other words, the unpermeated liquid represents the portion other than the "permeated liquid" of the used liquid and is constituted mainly or substantially by liquid components, although the unpermeated liquid may have a solid content as residue of the filtration, depending on the characteristics of the used liquid.

There is no particular limitation on the filtrating means, but cross flow filtration is preferable in view of filtration precision (particle or molecular weight size) preferable to the cleanliness, the clarity, the particle density, etc. of the alkali-based treating liquid required for manufacturing of devices such as semiconductor devices and liquid crystal devices. In this case, the used liquid is filtrated into an unpermeated liquid containing substances of the fraction size (filtration size) or larger and a permeated liquid containing substances smaller than the fraction size.

The unpermeated liquid contains the first component, i.e., organic component of the fraction size or larger, or the second component or the third component, and if this unpermeated liquid is added to the used liquid in the unpermeated liquid adding step, it can be used to adjust the concentration of the first, second and third components dissolved in the used liquid. Therefore, it is not necessary to separately supplement fresh first, second and third components in the adjusting step. If the filtration size is set as appropriate in the filtrating step, metal ions in the unpermeated liquid can be reduced sufficiently, so that this is preferable for adjustment of the concentrations in the adjusting step.

It is further preferable to include (6) a post-treating step performed between the adjusting step and the supplying step, including a particle removing step of removing a particle component from the regenerated liquid, because contamination of particles in the treating process can be prevented.

In another aspect, a treating liquid adjusting equipment of the present invention is an equipment for adjusting an alkali-based treating liquid for use in treating an organic film applied onto a substrate and includes an adjusting portion for adjusting the alkalinity of the alkali-based treating liquid such that the concentration of a first component (dissolved organic film component) contained in the alkali-based treating liquid and constituting an organic film of the same type as or a different type from the organic film is in the range of 0.001 to 2.0 mass %, and the concentration of an alkali component contained in the alkali-based treating liquid is in the range of 0.05 to 2.5 mass %.

It is preferable that when the organic film is a photoresist and the treatment is a development, the adjusting portion adjusts the alkalinity of the alkali-based treating liquid such that the concentration of a second component, serving as the first component, contained in the alkali-based treating liquid and constituting an organic film of the same type or a different type from the photoresist to be developed is in the range of 0.001 to 2.0 mass %, and the concentration of an alkali component contained in the alkali-based treating liquid is in the range of 0.1 to 2.5 mass %.

Alternatively, it is also preferable that when the organic film is a functional film, the adjusting portion adjusts the alkalinity of the alkali-based treating liquid such that the concentration of a third component, serving as the first component, contained in the alkali-based treating liquid and constituting an organic film of the same type as or different type from the functional film to be treated is in the range of 0.001 to 0.5 mass %, and the concentration of an alkali component contained in the alkali-based treating liquid is in a range of 0.05 to 2.4 mass %.

In another aspect, an alkali-based developing liquid supplying equipment of the present invention is an equipment for supplying an alkali-based treating liquid to a treating portion of an organic film applied onto a substrate includes (a) a receiving portion to which a used liquid containing a first component (dissolved organic film component) constituting an organic film of a same type as or different type from the organic film is supplied; (b) a concentration measuring portion for measuring concentrations of the first component and an alkali component contained in the used liquid; (c) an adjusting portion for adjusting the alkalinity of the used liquid, based on the actually measured concentration values of the first component and the alkali component, such that the concentration of the first component contained in the used liquid is in the range of 0.001 to 2.0 mass %, and the concentration of the alkali component contained in the used liquid is in the range of 0.05 to 2.5 mass %, thereby producing a regenerated liquid; and (d) a supplying portion for supplying the regenerated liquid to the treating portion.

Furthermore, it is preferable that when the organic film is a photoresist, the receiving portion receives a used liquid containing a second component constituting an organic film of the same type or a different type from the photoresist as the used liquid; the concentration measuring portion measures concentrations of the second component and an alkali component contained in the used liquid; and the adjusting portion adjusts an alkalinity of the used liquid, based on the actually measured concentration values of the second component and the alkali component, such that a concentration of the second component contained in the used liquid is in a range of 0.001 to 2.0 mass %, and a concentration of the alkali component contained in the used liquid is in a range of 0.1 to 2.5 mass %.

Alternatively, it is also preferable that when the organic film is a functional film, the receiving step receives a used liquid containing a third component constituting an organic film of a same type or different type from the functional film as the used liquid; the concentration measuring portion measures concentrations of the third component and an alkali component contained in the used liquid; and the adjusting portion adjusts an alkalinity of the used liquid, based on the actually measured concentration values of the third component and the alkali component, such that the concentration of the third component contained in the used liquid is in the range of 0.001 to 0.5 mass %, and a concentration of the alkali component contained in the used liquid is in the range of 0.05 to 2.4 mass %.

More specifically, it is more preferable to include (e) a pre-treating portion provided between the receiving portion and the adjusting portion, including at least one portion selected from the group consisting of a filtrating portion for filtrating the used liquid; a residual component removing portion for removing the first component (or the second component or the third component) that remains in the used liquid; and a metal component removing portion for removing a metal component contained in the used liquid.

It is further preferable that the filtrating portion filtrates the used liquid into a permeated liquid and an unpermeated liquid by cross flow filtration, and the treating liquid supplying equipment includes (f) an unpermeated liquid transferring portion connected to the filtrating portion and the adjusting portion, for transferring the unpermeated liquid from the filtrating portion to the adjusting portion. It is even more preferable to include (g) a post-treating portion provided between the adjusting portion and the supplying portion, including a particle removing portion for removing a particle component contained in the regenerated liquid.

In addition, it is useful to include (h) a leveling portion connected to the adjusting portion, to which the regenerated liquid is spontaneously transferred from the adjusting portion by water head pressure difference, for leveling the concentrations of the first component (or the second component or the third component) and the alkali component contained in the regenerated liquid. This makes it easy to supply the regenerated liquid to serve as the alkali-based treating liquid to the treating portion of the organic film consecutively, and the concentrations of the first component (or the second component or the third component) and the alkali component contained in the regenerated liquid supplied can be maintained more stably than being supplied by a batch system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
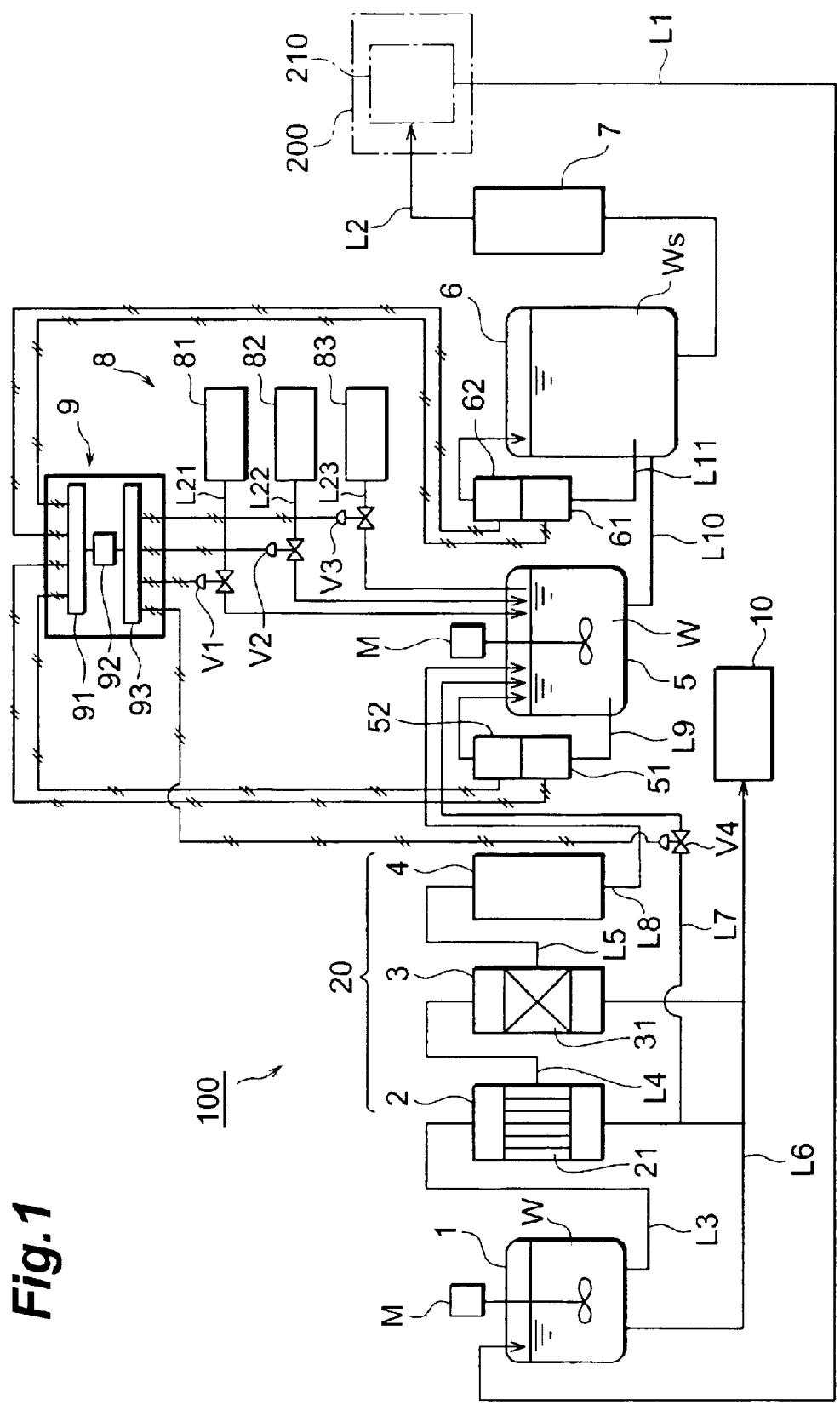
FIG. 1 is a schematic view showing the configuration of a preferred embodiment of a developing liquid supplying equipment of the present invention.

Hereinafter, embodiments of the present invention will be described in detail. The alkali-based treating liquid of the present invention is for use in treating an organic film applied onto a substrate in a photolithography process applied to the manufacturing of devices such as semiconductor devices and liquid crystal devices or microprocessing thereof, especially in developing a photoresist or treating a functional film. In the alkali-based treating liquid of the present invention, a first component (an organic film component) constituting the same or a different type organic film as the organic film to be treated is dissolved in a concentration of 0.001 to 2.0 mass %.

First Embodiment

This embodiment is an embodiment where the organic film is a photoresist. In this embodiment, the alkali-based treating liquid functions as an alkali-based developing liquid of the photoresist. There is no limitation regarding a dissolved photoresist component (second component dissolved) as the dissolved organic film component contained in the alkali-based developing liquid (alkali-based treating liquid). The dissolved photoresist component can be the same or a different type as the photoresist to be treated, but preferably has a good affinity with the photoresist to be developed. From this viewpoint, it is preferable to use the same type as the photoresist to be developed, for example, a material containing the same matrix resin, more preferably a material also containing the same photosensitizer component, and even more preferably a material having the same or substantially the same composition.

Specific examples of such a photoresist include matrix materials such as novolac resins or acrylic resins containing diazoquinone, in particular, diazoquinone-based photosensitizer. These have been commonly used in photolithography in the manufacturing of semiconductor devices and liquid crystal devices in recent years.

In the preferable range, the concentration can be controlled as appropriate, in accordance with the type of the photoresist to be treated and/or the alkali. For example, for an alkali-based developing liquid for photoresists for use in the manufacturing of semiconductor devices, it is useful that the alkali component (e.g., TMAH) is contained preferably in 2.2 to 2.4 mass % (more specifically 2.375 to 2.385 mass %), and more preferably 2.3 to 2.4 mass % (more specifically 2.377 to 2.383 mass %).

For an alkali-based developing liquid for photoresists (e.g., DQN resists) for use in the manufacturing of liquid crystal devices, it is useful that the alkali component is contained preferably in 2.2 to 2.4 mass % (more specifically 2.370 to 2.390 mass %), and more preferably 2.3 to 2.4 mass % (more specifically 2.375 to 2.385 mass %).

Next, a method and an equipment for adjusting a treating liquid and a method and an equipment for supplying a treating liquid will be described with reference to the accompanying drawings. The same elements bear the same reference numerals, and duplicate description will be omitted. The positional relationship such as the vertical and horizontal positional relationship is based on the positional relationship shown in the drawings, unless otherwise indicated. The size ratio in the drawings is not limited to the ratio shown in the drawings.

FIG. 1 is a schematic view showing the arrangement of a preferred embodiment of an equipment for supplying a treating liquid of the present invention. A developing liquid supplying equipment 100 (treating liquid supplying equipment, which also serves as a treating liquid adjusting equipment) is connected to a development treating equipment 210 (treating portion) of a semiconductor manufacturing facility 200 via lines L1 and L2 (supplying portion), and thus circulates and supplies the alkali-based developing liquid of the present invention to the development treating equipment 210. In the developing liquid supplying equipment 100, in the following stages of a receiving bath 1 (receiving portion) connected to a line L1, a pre-treating portion 20, an adjusting bath 5 and a leveling bath 6 (leveling portion) are sequentially provided. The line L2 (supplying portion) provided with a particle removing device 7 (particle removing portion) is connected to the leveling bath 6 in the last stage.

The receiving bath 1 is provided with an agitator M, and a used liquid W that has been used in development of photoresists in the development treating equipment 210 is introduced through the line L1. The pre-treating portion 20 in the next stage includes a filter 2, a residual photoresist removing device 3, and a metal ion removing device 4, which are provided in this order via lines L3 to L5.

The filter 2 (filtering portion) is provided with a membrane separation module 21 constituted by a single or a plurality of filtration membranes or a multiple stage unit thereof, and the used liquid W supplied from the receiving bath 1 is filtrated therein. There is no particular limitation regarding the type of the membrane used for the membrane separation module 21, and for example, microfiltration (MF) membranes, ultrafiltration (UF) membranes, nanofiltration (NF) membranes, reverse osmosis (RO) membranes or the like can be used.

These can be used when appropriate, depending on the necessary filtration precision. From the viewpoint of being used in a semiconductor manufacturing facility 200, MF membranes, UF membranes, NF membranes or RO membranes, which permit high performance filtration (cross-flow filtration) with cross flow, are preferable and it is preferable to use UF membranes or NF membranes in terms of filtration performance, filtration speed, and convenience. There is no limitation regarding the characteristics of the membranes, and the membranes can be flat membranes or hollow fiber membranes, for example.

Similarly to the filter 2, the residual photoresist removing device 3 (residual component removing portion) is provided with a membrane separation module 31 constituted by a single or a plurality of filtration membranes or a multiple stage unit thereof, and further filtrates permeated components (a permeated liquid in the case where cross-flow filtration with UF, NF membranes and the like is performed, and referred to as "permeated liquid" hereinafter) supplied from the membrane separation module 21 via a line. There is no particular limitation regarding the type of the membrane used for the membrane separation module 31, but a membrane having a higher filtration precision than that of the membrane of the membrane separation module 21 of the filter 2 (e.g., having a smaller pore size than that of the membrane separation module 21) can be used.

For example, when MF membranes are used for the membrane separation module 21, it is preferable to use UF membranes, NF membranes or RO membranes for the membrane separation module 31. Similarly, when UF membranes are used for the former, it is preferable to use NF membranes or RO membranes for the latter. When NF membranes are used for the former, it is preferable to use RO membranes for the latter. The same type of membranes can be used for the former and the latter. In this case, it is preferable that the filtration precision of the membrane separation module 31 is higher, as described above.

The receiving bath 1, the filter 2, and the residual photoresist removing device 3 are connected to a drain system 10 through a line L6. Thus, excessive liquid from the receiving bath 1, and unpermeated liquid from the filter 2 and the residual photoresist removing device 3 are discharged to the drain system 10. Furthermore, a portion of the unpermeated liquid from the filter 2 is transferred to the adjusting bath 5 through a line L7 (an unpermeated liquid transferring portion) having a flow adjusting valve V4.

The adjusting bath 5 is connected to the metal ion removing device 4 via a line L8, and includes an agitator M inside. Furthermore, a circulation line L9 provided with densitometers 51 and 52 is provided outside the adjusting bath 5. The leveling bath 6 is connected to the adjusting bath 5 via a line L10, and a regenerated liquid Ws as described later that has been adjusted by the adjusting bath 5 is spontaneously supplied to the leveling bath 6. A circulation line L11 provided with densitometers 61 and 62 is provided outside the leveling bath 6.

The densitometer 51 detects the concentration of the dissolved photoresist component contained in the used liquid W in the adjusting bath 5, and various meters such as an absorptiometer, a refractometer, a viscosimeter, an ultrasonic densitometer, a liquid densitometer, or an automated titration device can be used. For example, Japanese Patent No. 2561578 by applicants including the applicant of the present invention discloses a high correlation between the concentration of a dissolved resin in an alkali-based developing liquid and its absorbance, and it is understood that the concentration of the dissolved photoresist component can be measured with high precision by an absorptiometer.

On the other hand, the densitometer 52 detects the concentration of the alkali component contained in the used liquid W in the adjusting bath 5, and various meters such as a conductivitymeter, an ultrasonic densitometer, a liquid densitometer, an automated titration device or a phase difference densitometer with an electromagnetic coil can be used. For example, the aforementioned patent No. 2561578 discloses a high correlation between the alkali concentration of an alkali-based developing liquid and its conductivity, and it is understood that the concentration of the alkali component can be measured with high precision by a conductivity meter. Thus, the densitometers 51 and 52 constitute a concentration measuring portion.

The densitometers 61 and 62 detect the concentrations of the dissolved photoresist component and the alkali component of the regenerated liquid Ws in the leveling bath 6, respectively, and the same meters as the densitometers 51 and 52 can be used, respectively.

The developing liquid supplying equipment 100 is further provided with a liquid providing system 8 and a control device 9. The liquid providing system 8 includes a pure water providing system 81, a raw developing liquid providing system 82 and a fresh developing liquid providing system 83, which are connected to the adjusting bath 5 via lines L21 to L23 having flow rate adjusting valves V1 to V3, respectively. The pure water providing system 81 has a device (not shown) for storing or producing so-called pure water or extra pure water whose ion concentration, particle concentration or the like are controlled as appropriate.

On the other hand, the raw developing liquid providing system 82 contains a TMAH solution whose alkali component concentration is adjusted to about 20 mass %. The fresh developing liquid providing system 83 contains a fresh liquid of a developing liquid obtained by previously diluting the raw developing liquid to a predetermined concentration, for example, a TMAH solution whose alkali component concentration is adjusted to about 2.38 mass %.

In the control device 9, a computing portion 92 such as CPU or MPU is connected to interfaces 91 and 93. The interface 91 is an input interface, and is connected to the densitometers 51, 52, 61 and 62, and concentration detection signals of the dissolved photoresist component and the alkali component obtained by these densitometers are input to the computing portion 92 via the interface 91. On the other hand, the interface 93 is an output interface, and is connected to the flow rate adjusting valves V1 to V4, and control signals for valve opening/closing amounts, opening/closing period of time or time from the computing portion 92 are output to the valves. The control device 9, the adjusting bath 5 and the liquid providing system 8 constitute an adjusting portion.

There is no particular limitation regarding the specific removing means used as the particle removing device 7 provided in the line L2 connecting the leveling bath 6 and the development treating equipment 210, but since particles are fine particle components, it is preferable to use filtrating means such as membrane filtration for reliable and simple processes.

Figure 2:
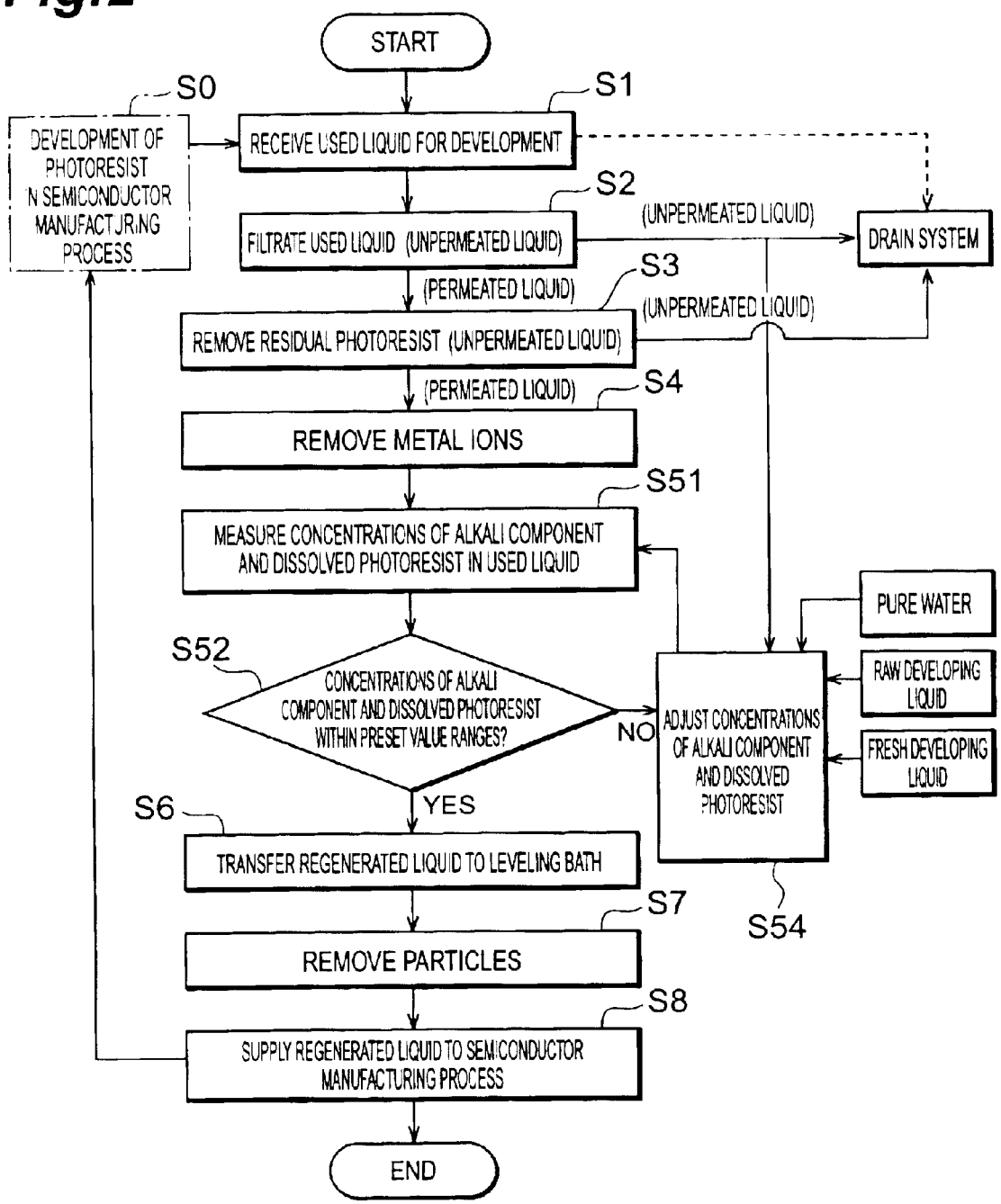
FIG. 2 is a flowchart showing the outline of the procedure of a preferred embodiment of a developing liquid supplying method of the present invention.

An example of the treating liquid adjusting method and the treating liquid supplying method of the present invention using the thus configured developing liquid supplying equipment 100 will be described. FIG. 2 is a flowchart showing the outline of the procedure of a preferred embodiment of the treating liquid supplying method of the present invention. In each of the following steps, the temperature is adjusted as appropriate, if necessary.

First, a process starts, and a used liquid W used for development is received in the receiving bath 1 from the development treating equipment 210 of the semiconductor manufacturing facility 200 through the line L1 (step S1; receiving step). Then, the used liquid W that has been agitated and mixed sufficiently with the agitator M in the receiving bath 1 is introduced to the filter 2 through the line L3, and passed through the membrane separation module 21 for filtration (step S2; filtrating step). Then, a permeated liquid is supplied to the residual photoresist removing device 3 through the line L4, and a portion of the unpermeated liquid is supplied to the adjusting bath 5 through the line L7, as described below. The rest of the unpermeated liquid is supplied to the drain system 10 through the line L6.

The residual photoresist removing device 3 removes the residual photoresist, for example dissolved in the used liquid W by membrane filtration (step S3; residual component removing step). The permeated liquid that is free from the photoresist is introduced to the metal component removing device 4 through the line L5, and metal ions are removed from the used liquid (step S4; metal ion removing step). Thus, steps S2 to S4 constitute a pre-treating process.

Then, the used liquid W that is free from metal ions is supplied to the adjusting bath 5. In the adjusting bath 5, the used liquid W is agitated and a portion thereof is circulated through a line L9. Meanwhile, the concentrations of the dissolved photoresist component and the alkali component of the used liquid W are measured with the densitometers 51 and 52 (step S51; concentration measuring process). More specifically describing by taking as an example the case where the densitometers 51 and 52 are an absorptiometer and a conductivitymeter, respectively, first, at the time when the used liquid circulating the circulation line L9 is passed through the densitometers 51 and 52, absorbance detection signals corresponding to the absorbance and conductivity detection signals corresponding to the conductivity are output to the control device 9 continuously or intermittently.

In the computing portion 92, correlation data of the concentrations of the dissolved photoresist component and the alkali component with respect to the strength of these detection signals have been input or stored in advance. The concentrations of the dissolved photoresist component and the alkali component (hereinafter, referred to as "actually measured concentration value") in the adjusting bath 5 are obtained based on the actually measured detection signal strength. Moreover, in the computing portion 92, desired preset values of the concentrations of the dissolved photoresist component and the alkali component have been input or stored in advance. In the computing portion 92, a difference between the concentration values that are preset in this manner (hereinafter, referred to as "preset concentration value") and the actually measured concentration value is further obtained.

In this embodiment, the preset concentration value of the dissolved photoresist component is in the range of 0.001 to 2.0 mass %, preferably 0.01 to 1.5 mass %, more preferably 0.1 to 1.0 mass %. The preset concentration value of the alkali component is preferably in the range of 0.1 to 2.5 mass %.

When the actually measured concentration value of the dissolved photoresist component is smaller than the preset concentration value, for example, a signal for opening a valve for a certain time is output from the control device 9 to the flow-rate adjusting valve V4, and the photoresist is supplied to the adjusting bath 5 (unpermeated liquid adding step). When the actually measured concentration value of the dissolved photoresist component is larger than the preset concentration value, for example, a signal for opening a valve for a certain time is output to the flow-rate adjusting valve V3, and the fresh liquid is supplied to the adjusting bath 5.

Similarly, when the actually measured concentration value of the alkali component is smaller than the preset concentration value, for example, a signal for opening a valve for a certain time is output from the control device 9 to the flow-rate adjusting valve V2, and raw developing liquid is supplied to the adjusting bath 5. When the actually measured concentration value of the alkali component is larger than the preset concentration value, for example, a signal for opening a valve for a certain time is output to the flow-rate adjusting valve V1, and pure water is supplied to the adjusting bath 5.

Then, the concentrations of the dissolved photoresist component and the alkali component are measured continuously or intermittently, while the used liquid W to which pure water or the like has been added is agitated and mixed sufficiently with the agitator M. Then, until the difference between the actually measured concentration value and the preset concentration value is a predetermined value, or until the actually measured concentration value reaches the above-described concentration range, when the above-described concentration range is set as the preset concentration value (step S52), the alkalinity adjustment of the concentrations of the dissolved photoresist component and the alkali component in the used liquid W is continued (step S54). Thus, steps S52 to S54 constitute an adjusting process.

Next, the used liquid W whose concentration has been adjusted is transferred to the leveling bath 6 as a regenerated liquid Ws. The regenerated liquid Ws is spontaneously supplied through the line L10. In other words, the liquid is constantly supplied from the adjusting bath 5 to the leveling bath 6 in accordance with the difference in the water head pressure between them, as long as the line L10 is not closed. Therefore, the leveling bath 6 can function as a buffer bath for the regenerated liquid Ws whose concentrations of the dissolved photoresist component and the alkali component are normalized.

Alternatively, the concentrations of the dissolved photoresist component and the alkali component of the regenerated liquid Ws in the leveling bath 6 may be measured with the densitometers 61 and 62. The alkalinity in the adjusting bath 5 and the leveling bath 6 is equal in principle, but when there is some difference, for example, due to the arrangement conditions of the two baths or the timing of supplying liquid, it is possible to control such that the actually measured concentration values obtained from the densitometers 61 and 62 are output to the control device 9 so as to feedback these actually measured concentration values for adjustment of the alkalinity in the adjusting bath 5. It is not necessary to measure the concentrations with the densitometers 61 and 62 continuously all the time, and if such adjustment of the concentrations is not necessary, it is not necessary to provide the densitometers 61 and 62.

Then, the regenerated liquid Ws is supplied to the particle removing device 7 through the line L2 in order to remove the fine particle component (step S7; particle removing step, post-treatment process). Then, the necessary amount of the regenerated liquid Ws from which particles have been removed is supplied to the development treating equipment 210 through the line L2 (supplying process) and thus the process for supplying an alkali-based developing liquid ends.

According to the developing liquid supplying equipment 100 having this arrangement and the treating liquid supplying method using this equipment, the regenerated liquid of the alkali-based developing liquid to be supplied to the development treating equipment 210 contains the dissolved photoresist component in a concentration of 0.001 to 2.0 mass %. Therefore, the permeability and the wettability of the liquid to the photoresist that has been applied on a substrate such as wafer and exposed can be improved. When the concentration of the dissolved photoresist component is less than 0.001 mass %, the permeability to the photoresist is not sufficient. On the other hand, when it exceeds 2.0 mass %, erosion (edge effect) may be significant in an edge portion on the upper surface of the photoresist remaining as a pattern (corresponding to an unexposed portion in the positive resist).

Therefore, sufficient permeability can be obtained by adjusting the concentration of the dissolved photoresist component to be in the range of 0.001 to 2.0 mass %. In other words, the degree of the absorption into the photoresist during development is improved, and the deterioration of the shape controllability of patterns can be suppressed. Therefore, permeation and dissolution to a photoresist surface layer in an unexposed portion can be achieved, and production of a slightly soluble layer and peeling thereof can be suppressed. In addition, adverse effects to a treatment in the following processes after the development can be prevented. As a result, for example, poor etching of a lower layer that seems to be caused by the peeling of a slightly soluble layer or other problems can be prevented sufficiently, so that yield loss of semiconductor devices or liquid crystal devices can be suppressed.

Furthermore, even if the concentration of the dissolved photoresist component exceeds 2.0 mass %, the permeability corresponding to the concentration tends not to be exhibited. Therefore, when this concentration is 2.0 mass % or less, excessive use of the dissolved photoresist component can be suppressed, which reduces time and cost.

Furthermore, since the concentration of the alkali component contained in the regenerated liquid is preferably 0.1 to 2.5 mass %, a rate of dissolution of the photoresist that is sufficient in practical use can be obtained. When the concentration of the alkali component is more than 2.5 mass %, the solubility corresponding to an increase of the concentration cannot be obtained, and in some cases, this concentration makes it difficult to control the solubility of the photoresist and the patterning geometry thereof. When TMAH as described above is used as the alkali, a concentration of about 20 mass % is commonly used for a raw liquid of a TMAH solution. Therefore, too high a concentration may make it difficult to adjust the alkalinity.

When the present invention is used for development of a photoresist in the manufacturing of semiconductor devices as shown in FIG. 1, it is useful that the concentration of the alkali component (e.g., TMAH) in the regenerated liquid is preferably 2.2 to 2.4 mass %, more preferably 2.3 to 2.4 mass %. This provides the advantage that patterning by which unexposed portions having predetermined line width and thickness are formed can be performed with very good reproducibility and reliability.

When the present invention is used for development of a photoresist (e.g., DQN resist) in the manufacturing of liquid crystal devices, the concentration of the alkali component in the regenerated liquid is preferably 2.2 to 2.4 mass %, more preferably 2.3 to 2.4 mass %. Also in this case, patterning by which unexposed portions having predetermined line width and thickness are formed can be performed with very good reproducibility and reliability.

With the developing liquid supplying equipment 100, the regenerated liquid obtained from the used liquid that has been used for development can be supplied to the development treating equipment 210 as the alkali-based developing liquid of the present invention. Therefore, the amount of liquid wastes produced can be significantly reduced, compared to conventional cases where fresh liquid is used and disposed of after one use. Further more, the unpermeated liquid from the filter 2 in the pre-treating process is used to adjust the concentration of the dissolved photoresist component, and therefore the dissolved photoresist component can be used efficiently and liquid wastes can be reduced further.

Furthermore, the concentrations of the dissolved photoresist component and the alkali component of the used liquid W in the adjusting bath 5 are measured, and the alkalinity is adjusted, based on the actually measured concentration values, so that the concentration can be controlled with excellent accuracy and precision. In this case, when the concentration is adjusted continuously or intermittently, the concentrations of the dissolved photoresist component and the alkali component can be maintained at predetermined concentrations or in predetermined concentration ranges more reliably and stably. Moreover, stable supply of the regenerated liquid to the development treating equipment 210 can become more reliable by using the leveling bath 6 and further supplying the actually measured concentration values in the leveling bath 6 to the adjustment of the concentrations in the adjusting bath 5.

Second Embodiment

This embodiment is an embodiment where the organic film is a functional film. In this embodiment, the alkali-based treating liquid functions as a treating liquid for formation of various functional films. There is no limitation regarding a dissolved functional film component (third component dissolved) as the organic film component contained in the treating liquid for formation (alkali-based treating liquid). The dissolved functional film component can be the same or a different type as the functional film to be treated, but preferably has a good affinity with the functional film to be treated. From this viewpoint, it is preferable to use the same type as the functional film to be treated, for example, a material also containing the same matrix resin, more preferably a material containing the same photosensitizer component, and even more preferably a material having the same or substantially the same composition.

As described above, such a functional film is a permanent film that contains a photosensitive organic polymer resin as the main component, can be treated with the alkali treating liquid to have a desired patterning geometry, and can stay in a substrate as a structural element without being subjected to a stripping process thereafter to carry out various required functions. In general, the functional film is based on an alkali soluble organic resin, and can be classified into the positive type and the negative type, substantially like the photoresist, and a lithography process is commonly used to form and treat the functional film.

Examples of positive type functional films include films made of a solution of the following materials as the raw material: alkali soluble organic resins (unsaturated carboxylic acid, unsaturated carboxylic acid anhydride, epoxy group-containing unsaturated compounds, resins containing copolymers of olefin based unsaturated compounds or the like, resins containing alkali soluble cyclic polyolefin based resins, etc.), solvents, or 1,2-quinone diazide compounds serving as a photosensitizer. On the other hand, Examples of negative type functional films include films made of a solution of the following materials as the raw material: alkali soluble organic resins (unsaturated carboxylic acid, unsaturated carboxylic acid anhydride, epoxy group-containing unsaturated compounds, resins containing copolymers of olefin based unsaturated compounds or the like), polymeric compounds having an ethylene unsaturated bond, solvents, or radiation-sensitive polymerization initiator.

Classifying the functional films from the viewpoint of usage, for example, protective films for preventing the degradation or damage of liquid crystal display devices, semiconductor circuit devices and the like, a smoothing films for smoothing the surface of the devices, interlayer insulating films for insulating interconnects disposed in the form of layers, spacers for maintaining a constant interval between two substrates that seal the liquid crystal of a liquid crystal panel, liquid crystal alignment films capable of aligning liquid crystal, light-scattering films for achieving a high front brightness for semi-transparent and reflective liquid crystal displays, and low dielectric constant films having low dielectric constants, etc. can be used. Moreover, microlenses serving as optical devices are also examples of the organic functional films. These functional films have superior characteristics in electrical insulation, smoothness, heat resistance, transparency, chemical resistance, mechanical strength and the like.

There is no particular limitation regarding the alkali component contained in the alkali-based treating liquid of this embodiment. For example, hydroxides of alkali metals and substituted or unsubstituted ammonium hydroxides can be used. Among these, TMAH and KOH are preferable. The concentration of the alkali component is preferably 0.05 to 2.4 mass %, more preferable 0.08 to 2.4 mass %. The preset concentration value of the dissolved functional film component (third component dissolved) contained in the alkali-based treating liquid is preferably in the range of 0.001 to 0.5 mass %, and more preferably 0.01 to 0.3 mass %.

In such preferable ranges, the concentration of the alkali component can be controlled as appropriate in accordance with the type of the functional film to be treated and/or the alkali. For example, for the alkali-based treating liquid for a negative type (meth) acrylic functional film that is preferably used as a protective film and a spacer, it is useful that the concentration of the alkali component (e.g., TMAH) is preferably 0.05 to 0.6 mass %, and more preferably 0.08 to 0.12 mass %. For the alkali-based treating liquid for a positive type (meth) acrylic functional film that is preferably used as a protective film or an interlayer insulating film and a spacer, it is useful that the concentration of the alkali component (e.g., TMAH) is preferably 0.05 to 0.6 mass %, and more preferably 0.1 to 0.3 mass %.

For the alkali-based treating liquid for a negative type (meth) acrylic functional film that is preferably used as a protective film and a liquid crystal alignment film, it is useful that the concentration of the alkali component (e.g., TMAH) is preferably 0.05 to 0.6 mass %, and more preferably 0.3 to 0.6 mass %. For the alkali-based treating liquid for a positive type epoxy based functional film that is preferably used as a microlens, it is useful that the concentration of the alkali component (e.g., TMAH) is preferably 0.5 to 2.4 mass %, and more preferably 1.0 to 2.4 mass %. For the alkali-based treating liquid for a negative type (meth)acrylic functional film that is preferably used as an interlayer insulating film, it is useful that the concentration of the alkali component (e.g., TMAH) is preferably 1.0 to 2.4 mass %, and more preferably 2.3 to 2.4 mass %.

As a method and an equipment for adjusting a treating liquid and a method and an equipment for supplying a treating liquid of the present invention that are preferable in this embodiment, a treating liquid adjusting equipment and a treating liquid supplying equipment that are configured in the same manner as the developing liquid supplying equipment 100, except that the "photoresist" and the "development" are replaced by a "functional film" and "formation and treatment" of various functional films, respectively, and the alkali-based developing liquid is replaced by the above-described alkali-based treating liquid in accordance with the various functional films, and a treating liquid adjusting method and a treating liquid supplying method can be used, for examples.

According to this embodiment, the regenerated liquid of the alkali-based treating liquid contains the dissolved functional film component in a concentration of 0.001 to 0.5 mass %. Therefore, the permeability and the wettability of the liquid to the functional film that has been applied on a substrate such as wafer and exposed can be improved. When the concentration of the dissolved functional film component is less than 0.001 mass %, the permeability to the functional film is not sufficient. On the other hand, when it exceeds 0.5 mass %, erosion may be significant on the upper surface of the functional film remaining as a pattern, and therefore a desired pattern cannot be obtained.

Therefore, sufficient permeability can be obtained by adjusting the concentration of the dissolved functional film component to be in the range of 0.001 to 0.5 mass %. In other words, the degree of the absorption into the functional film for formation and treatment is improved, and the deterioration of the shape controllability can be suppressed. Therefore, permeation and dissolution to a surface layer of the functional film in the remaining unexposed or exposed portion can be achieved, and production of a slightly soluble layer and peeling thereof can be suppressed. As a result, for example, poor etching of a lower layer that seems to be caused by the peeling of a slightly soluble layer or other problems can be prevented sufficiently, so that yield loss of structures provided with the functional film can be suppressed.

Furthermore, even if the concentration of the dissolved functional film component exceeds 0.5 mass %, the permeability corresponding to the concentration tends not to be exhibited. Therefore, when this concentration is 0.5 mass % or less, excessive use of the dissolved functional film component can be suppressed, which reduces time and cost.

Furthermore, since the concentration of the alkali component contained in the regenerated liquid is preferably 0.05 to 2.4 mass %, the rate of dissolution of the functional film that is sufficient in practical use can be obtained. When the concentration of the alkali component is more than 2.4 mass %, the solubility corresponding to an increase of the concentration cannot be obtained, and in some cases, this concentration makes it difficult to control the solubility of the functional film and the patterning geometry thereof. When TMAH as described above is used as the alkali, a concentration of about 20 mass % is commonly used for a raw liquid of a TMAH solution. Therefore, too high a concentration may make it difficult to adjust the alkalinity.

Since the regenerated liquid obtained from the used liquid that has been used for treatment can be supplied to the treating equipment as the alkali-based treating liquid of the present invention, the amount of liquid wastes produced can be significantly reduced, compared to conventional cases where fresh liquid is used and disposed of after one use. Furthermore, the unpermeated liquid from the filter 2 in the pre-treating process is used to adjust the concentration of the dissolved functional film component, and therefore the dissolved functional film component can be used efficiently and liquid wastes can be reduced further.

Furthermore, the concentrations of the dissolved functional film component and the alkali component of the used liquid W in the adjusting bath 5 are measured, and the alkalinity is adjusted, based on the actually measured concentration values, so that the concentration can be controlled with excellent accuracy and precision. In this case, if the concentration is adjusted continuously or intermittently, the concentrations of the dissolved functional film component and the alkali component can be maintained at predetermined concentrations or in predetermined concentration ranges more reliably and stably. Moreover, stable supply of the regenerated liquid to a treating equipment can become more reliable by using the leveling bath 6 and further supplying the actually measured concentration values in the leveling bath 6 to the adjustment of the concentrations in the adjusting bath 5.

The present invention is not limited to the above-described embodiments, and for example, instead of regenerating the used liquid W for use, an alkali-based developing liquid (alkali-based treating liquid of the present invention) obtained by dissolving a photoresist in a raw liquid or a fresh liquid and adjusting the concentration of the dissolved photoresist component can be used. Furthermore, instead of the residual photoresist removing device 3 provided with the membrane separation module 31, for example, an electrodialysis portion, an electrolysis portion, an ion exchange portion, or an evaporation and concentration portion can be configured. In view of downscaling of the facility and suppression of degradation of the alkali component, membrane filtration is advantageous.

It is preferable that the densitometers 51 and 52 have a temperature compensation function. Alternatively, it is preferable that the control device 9 has a temperature compensation function for actually measured concentration values, for example, a function for correcting detection signal strength based on the actually measured temperature values. Moreover, the treating liquid adjusting equipment of the present invention may be incorporated into the development treating equipment 210, and the treating liquid adjusting method of the present invention may be performed in the development treating equipment. An example of applications of this case is the developing liquid control equipment disclosed in the aforementioned Japanese Patent No. 2561578. In addition, the interfaces 91 and 93 may be replaced by input/output interfaces having input/output functions, and automated control with the control device 9 may be replaced by manual control.

It is preferable that the pre-treating portion 20, the post-treating portion, or the leveling bath 6 are provided, but they do not have to be provided, when the used liquid W is not used in the manner as described above, or depending on the unpollutedness of the used liquid W, even if it is used. Furthermore, as a pre-treatment or a post-treatment, gas dissolved in the used liquid W or the regenerated liquid Ws may be removed. Furthermore, a level gauge, a volumeter, or a gravimeter may be provided in the adjusting bath 5 or the leveling bath 6 to measure the liquid amount in the bath 5 or 6 so as to obtain the concentrations of the dissolved photoresist component and the alkali component.

The used liquid W can be regenerated not only once, but also a plurality of times, and in view of degradation of the developing liquid due to heat history, natural oxidation or the like, the used liquid W may be exchanged with a fresh liquid once every certain number of times or after a certain period of time of regeneration. For example, the following method may be used: the number of substrates that have been treated in the development treating equipment 210 is counted, and the used liquid is exchanged at the time when the count reaches a predetermined number. In the present invention, also when a fresh liquid is used, the concentration of the dissolved photoresist component is set in a predetermined range as described above.

The used liquid that has been used for a treatment such as development in a different facility from the semiconductor manufacturing facility 200 may be supplied to the receiving bath 1. In this case, the alkali-based treating liquid used in another facility can be supplied to the development treating equipment 210 of the semiconductor manufacturing facility 200 for reuse. The alkali-based treating liquid used there can be used in the semiconductor manufacturing facility 200 or another facility. The above-described alternative examples also can be applied to the treatment of the functional films as the organic film.

EXAMPLES

Hereinafter, specific examples of the present invention will be described, but the present invention is not limited thereto.

Example 1

A positive resist based on novolac/diazonaphthoquinone (NPR 3510PG manufactured by Nagase ChemteX Corporation) was dissolved in a fresh liquid of an alkali-based developing liquid containing TMAH as an alkali (NPD-18manufactured by Nagase ChemteX Corporation), and thus an alkali-based treating liquid of the present invention having a dissolved photoresist component concentration of 0.12 mass % and an alkali component concentration of 2.376 mass % was obtained.

Comparative Example 1

The fresh liquid (having an alkali component concentration of 2.380 mass %) used in Example 1 was taken as the alkali-based treating liquid of this comparative example.
Photoresist Dissolution Characteristics Test A wafer on which an ITO thin film was formed was spin-coated with a solution of the same photoresist as dissolved in the alkali-based treating liquid in Example 1 to a thickness of 1.5 $\mu$m, and was prebaked at 100° C. for 2 minutes. Thus, a sample for development was obtained. This sample was exposed under the following conditions: an exposure wavelength of 436 nm, an exposure intensity of 20 mJ/cm$^2$, and exposed portions and unexposed portion are present. The alkali-based treating liquids of Example 1 and Comparative Example 1 were supplied onto this exposed sample, and development was performed at a temperature of 23° C. The development was performed while monitoring the thickness of the photoresist with respect to development time, using DRM (Development Rate Monitor manufactured by PERKIN ELMER, model: MODEL E900).

Figure 3:
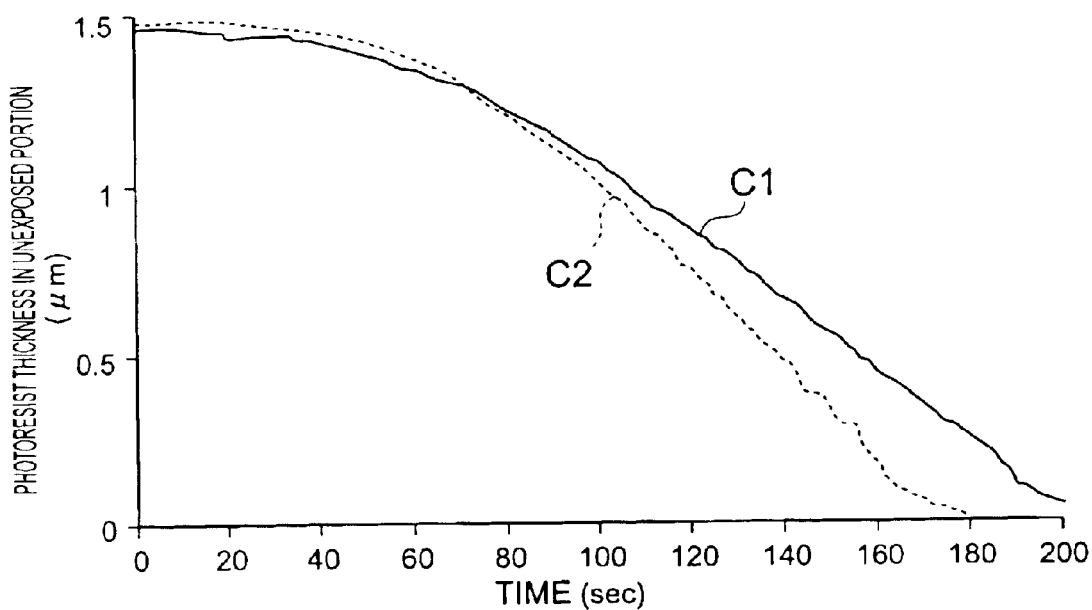
FIG. 3 is a graph showing a change in the thickness of the photoresist in an unexposed portion with respect to development time in a photoresist dissolution test.

FIG. 3 is a graph showing changes in the thickness of the photoresist in an unexposed portion with respect to development time in the photoresist dissolution test. The curves C1 and C2 show the results obtained by using the alkali-based treating liquids of Example 1 and Comparative Example 1, respectively. The graph confirms that in this test, the alkali treating liquid of Example 1 has a higher solubility with respect to the photoresist in the unexposed portion (film reduction amount) than that of Comparative Example 1, before the development time is about 70 seconds. Thereafter, the solubilities of Example 1 and Comparative Example 1 become opposite. That is to say, it was found that Example 1 was excellent in the solubility at an early stage of development with respect to the surface layer of the photoresist in the unexposed portion.

When the DRM analyzed wavelength in the unexposed portion during development was examined, the intensity of the first wave was changed comparatively significantly when the alkali-based treating liquid of Example 1 was used. The averages of the remaining film ratio (the ratio of the remaining thickness to the initial thickness) at a development time of 60 seconds of two samples were 95.3% for Example 1 and 96.2% for Comparative Example 1. These results also indicate that the thickness of the surface layer of the photoresist in the unexposed portion was changed faster with the alkali-based treating liquid of Example 1 than with the liquid of Comparative Example 1.

There are still unclear aspects about the details of this action mechanism, but one factor seems to be such that the alkali-based treating liquid of Example 1 has a higher surfactant effect with respect to the photoresist than the conventional alkali-based treating liquid of Comparative Example 1, so that the absorption into the photoresist surface layer is improved, and thus dissolution of the surface layer is promoted. However, the action is not limited thereto.

Example 2

The same positive resist based on Novolac/diazonaphthoquinone (NPR 3510PG manufactured by Nagase ChemteX Corporation) as used in Example 1 was dissolved in a fresh liquid of the same alkali-based developing liquid (NPD-18 manufactured by Nagase ChemteX Corporation) as used in Example 1 such that the dissolved photoresist component concentration was 0.005, 0.01, 0.05, 0.1, 0.5, 1.0, 1.5, and 2.0 mass %. Thus, various alkali-based developing liquids were obtained.

Surface Tension Measurement Test 1

Figure 4:
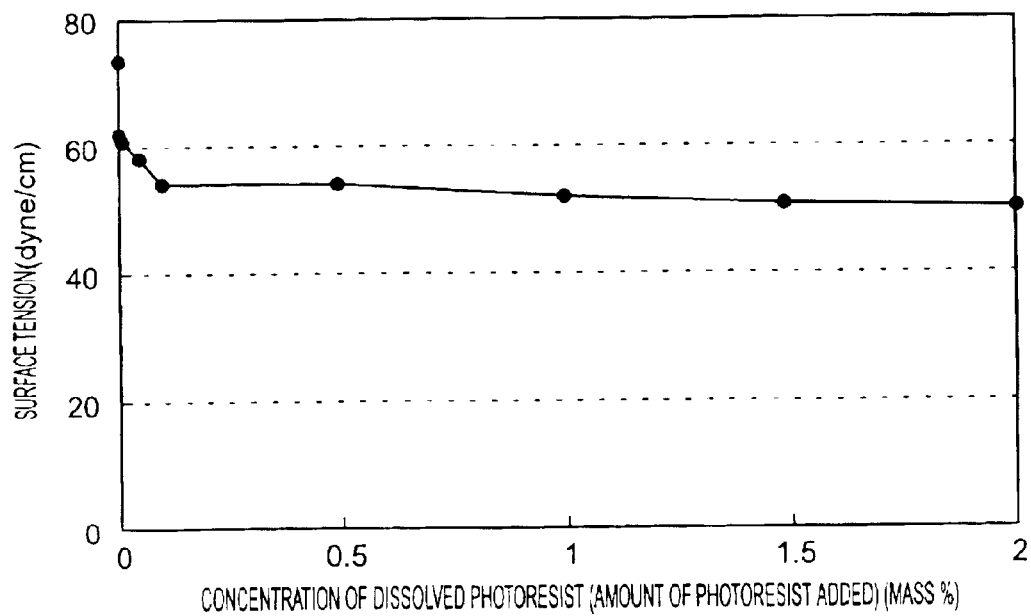
FIG. 4 is a graph showing a change in the surface tension (average) with respect to dissolved photoresist concentration.
Figure 5:
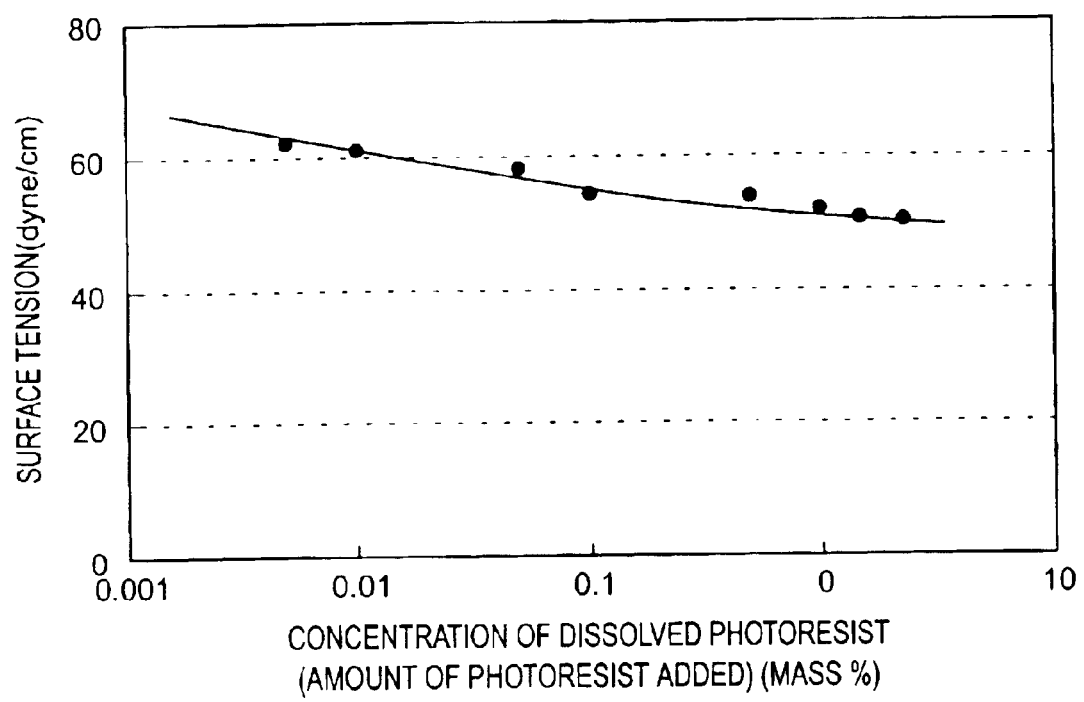
FIG. 5 is a graph showing a change in the surface tension (average) with respect to dissolved photoresist concentration.

The alkali-based treating liquids having various dissolved photoresist component concentrations that had been adjusted in Example 2 and the alkali-based treating liquid of Comparative Example 1 (a dissolved photoresist component concentration of 0%) were measured five times each regarding their surface tensions, using an automatic surface tension balance (CBVP-A3 manufactured by Kyowa Interface Science Co. Ltd.). Table 1 shows the results of the measurement and the averages. FIGS. 4 and 5 are graphs showing changes in the surface tension (averages) with respect to the dissolved photoresist component concentration, plotted in a linear scale and a logarithm scale in the horizontal axes, respectively.

TABLE 1

| | Dissolved photoresist concentration (%) | Surface tension measurement value (dyne/cm) | | | | | |
|---|---|---|---|---|---|---|---|
| | | 1st | 2nd | 3rd | 4th | 5th | Average |
| Com. Ex. 1 | 0 | 73.6 | 73.5 | 73.5 | 73.5 | 73.5 | 74 |
| Ex. 2 | 0.005 | 62.2 | 62.1 | 62.2 | 62.1 | 62.1 | 62 |
| | 0.01 | 61.2 | 61.1 | 61.0 | 60.9 | 60.8 | 61 |
| | 0.05 | 58.4 | 58.3 | 58.2 | 58.1 | 58.1 | 58 |
| | 0.1 | 54.3 | 54.5 | 54.5 | 54.5 | 54.5 | 54 |
| | 0.5 | 53.5 | 53.6 | 53.7 | 53.5 | 53.6 | 54 |
| | 1.0 | 52.1 | 52.6 | 52.5 | 52.5 | 52.5 | 52 |
| | 1.5 | 51.1 | 51.1 | 51.1 | 51.2 | 51.2 | 51 |
| | 2.0 | 50.2 | 50.1 | 50.2 | 50.3 | 49.9 | 50 |

These results confirm that when the dissolved photoresist component was added in a concentration of 0.001 mass % order or more to the fresh liquid, the surface tension was significantly reduced. An improvement of the wettability due to the reduction of the surface tension seems to be one factor to improvement of the absorption into the surface layer of the photoresist in the unexposed portion. In this test where the alkali component concentration was about 2.38 mass %, substantially from the point when the dissolved photoresist component concentration exceeds 0.1 mass %, the reduction of the surface tension becomes slow, and it is predicted that when it exceeds several mass %, the tendency of the reduction thereof tends to be saturated.

Example 3

As the raw liquid of the alkali treating liquid, a fresh liquid of the same alkali-based developing liquid (NPD-18 manufactured by Nagase ChemteX Corporation) as used in Example 1 was used, and a positive resist based on Novolac/diazonaphthoquinone (NPR 3510PG manufactured by Nagase ChemteX Corporation) was dissolved therein. Thus, alkali treating liquids of the present invention having a dissolved photoresist component concentration of 0.005, 0.1 and 0.3 mass % and an alkali component concentration of 0.4 mass % were obtained.

Comparative Example 2

An alkali treating liquid having an alkali component concentration of 0.4 mass % was obtained in the same manner as in Example 3, except that the positive resist was not dissolved.

Surface Tension Measurement Test 2

Figure 6:
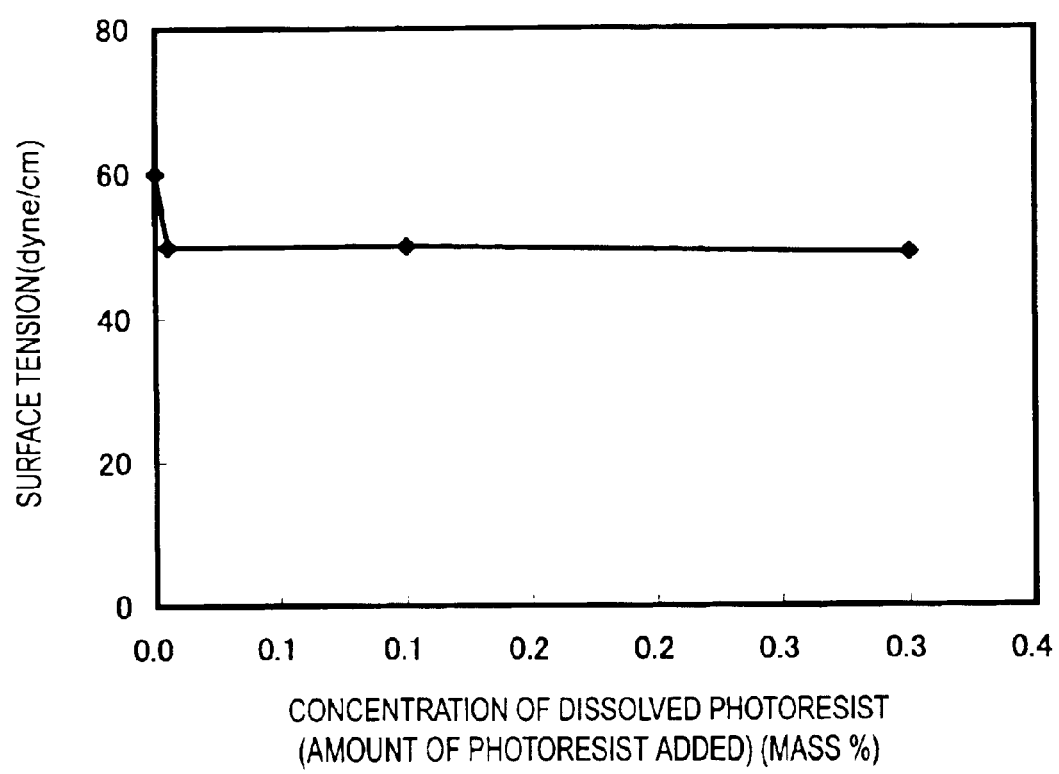
FIG. 6 is a graph showing a change in the surface tension (average) with respect to dissolved photoresist concentration.

The alkali-based treating liquids having various dissolved photoresist component concentrations that had been adjusted in Example 3 and the alkali-based treating liquid of Comparative Example 2 (a dissolved photoresist component of 0%) were measured five times each regarding their surface tensions, using an automatic surface tension balance (CBVP-A3 manufactured by Kyowa Interface Science Co. Ltd.). Table 2 shows the results of the measurement (averages alone). FIG. 6 is a graph showing changes in the surface tension (averages) with respect to the dissolved photoresist component concentration.

TABLE 2

|  | Dissolved photoresist concentration (%) | Surface tension measurement value (dyne/cm) Average |
| --- | --- | --- |
| Com. Ex. 2 | 0 | 60 |
| Ex. 3 | 0.005 | 50 |
|  | 0.1 | 50 |
|  | 0.3 | 49 |

In this test where the alkali component concentration was about 0.4 mass %, the reduction of the surface tension becomes slow from the point when the dissolved photoresist component concentration is about 0.3 mass %, and it is predicted that the tendency of the reduction thereof tends to be gradually saturated.

As described above, according to the alkali treating liquid of the present invention, when it is used for treatment such as development or formation treatment of an organic film applied onto a substrate, it is possible to reduce the amount of the liquid used and the amount of liquid wastes produced, to provide an excellent solubility to an organic film after exposure, and to prevent the surface layer of the organic film from peeling off after the treatment. According to the method and the equipment for adjusting a treating liquid and the method and the equipment for supplying a treating liquid, such an excellent alkali-based treating liquid of the present invention can be efficiently adjusted, and the alkali-based treating liquid of the present invention can be efficiently supplied to the treatment of the organic film.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A treating liquid adjusting equipment for adjusting an alkali-based treating liquid for use in treating an organic film applied onto a substrate, comprising:

an adjusting portion for adjusting an alkalinity of the alkali-based treating liquid such that a concentration of a first component contained in the alkali-based treating liquid and constituting an organic film of a same type as or different type from the organic film is in a range of 0.001 to 2.0 mass %, and a concentration of an alkali component contained in the alkali-based treating liquid is in a range of 0.05 to 2.5 mass %.

2. The treating liquid adjusting equipment according to claim 1, wherein when the organic film is a photoresist and the treatment is a development, the adjusting portion adjusts an alkalinity of the alkali-based treating liquid such that a concentration of a second component, serving as the first component, contained in the alkali-based treating liquid and constituting an organic film of a same type or different type from the photoresist to be developed is in a range of 0.001 to 2.0 mass %, and a concentration of an alkali component contained in the alkali-based treating liquid is in a range of 0.1 to 2.5 mass %.

3. The treating liquid adjusting equipment according to claim 1, wherein when the organic film is a functional film, the adjusting portion adjusts an alkalinity of the alkali-based treating liquid such that a concentration of a third component, serving as the first component, contained in the alkali-based treating liquid and constituting an organic film of a same type as or different type from the functional film to be treated is in a range of 0.001 to 0.5 mass %, and a concentration of an alkali component contained in the alkali-based treating liquid is in a range of 0.05 to 2.4 mass %.

4. A treating liquid, supplying equipment for supplying an alkali-based treating liquid to treating portion of an organic film applied onto a substrate, comprising:

a receiving portion to which a used liquid containing a first component (dissolved organic film component) constituting an organic film of a same type as or different type from the organic film is supplied;

a concentration measuring portion for measuring concentrations of the first component and an alkali component contained in the used liquid;

an adjusting portion for adjusting an alkalinity of the used liquid, based on the actually measured concentration values of the first component and the alkali component, such that a concentration of the first component contained in the used liquid is in a range of 0.001 to 2.0 mass %, and a concentration of the alkali component contained in the used liquid is in a range of 0.05 to 2.5 mass %, thereby producing a regenerated liquid; and a supplying portion for supplying the regenerated liquid to the treating portion.

5. The treating liquid supplying equipment according to claim 4, wherein when the organic film is a photoresist;

the receiving portion receives a used liquid containing a second component constituting an organic film of a same type or a different type from the photoresist as the used liquid;

the concentration measuring portion measures concentrations of the second component and an alkali component contained in the used liquid; and the adjusting portion adjusts an alkalinity of the used liquid, based on the actually measured concentration values of the second component and the alkali component, such that a concentration of the second component contained in the used liquid is in a range of 0.001 to 2.0 mass %, and a concentration of the alkali component contained in the used liquid is in a range of 0.1 to 2.5 mass %.

6. The treating liquid supplying equipment according to claim 4, wherein when the organic film is a functional film, the receiving step receives a used liquid containing a third component constituting an organic film of a same type or a different type from the functional film as the used liquid;

the concentration measuring portion measures concentrations of the third component and an alkali component contained in the used liquid; and the adjusting portion adjusts an alkalinity of the used liquid, based on the actually measured concentration values of the third component and the alkali component, such that a concentration of the third component contained in the used liquid is in a range of 0.001 to 0.5 mass %, and a concentration of the alkali component contained in the used liquid is in a range of 0.05 to 2.4 mass %.

7. The treating liquid supplying equipment according to claim 4, comprising a pre-treating portion provided between the receiving portion and the adjusting portion, including at least one portion selected from the group consisting of:

a filtrating portion for filtrating the used liquid;

a residual component removing portion for removing the first component that remains in the used liquid; and a metal component removing portion for removing a metal component contained in the used liquid.

8. The treating liquid supplying equipment according to claim 4, wherein the filtrating portion filtrates the used liquid into a permeated liquid and an unpermeated liquid by cross flow filtration, and the treating liquid supplying equipment includes an unpermeated liquid transferring portion connected to the filtrating portion and the adjusting portion, for transferring the unpermeated liquid from the filtrating portion to the adjusting portion.

9. The treating liquid supplying equipment according to claim 4, comprising a post-treating portion provided between the adjusting portion and the supplying portion, including a particle removing portion for removing a particle component contained in the regenerated liquid.

10. The treating liquid supplying equipment according to claim 4, comprising a leveling portion connected to the adjusting portion, to which the regenerated liquid is spontaneously transferred from the adjusting portion by water head pressure difference, for leveling the concentrations of the first component and the alkali component contained in the regenerated liquid.

* * * * *